United States Patent
Hirano et al.

(10) Patent No.: US 8,451,606 B2
(45) Date of Patent: May 28, 2013

(54) ELECTRONIC DEVICE

(75) Inventors: Masayoshi Hirano, Kawasaki (JP); Eiji Makabe, Kawasaki (JP); Takashi Imamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 82 days.

(21) Appl. No.: 13/005,588

(22) Filed: Jan. 13, 2011

(65) Prior Publication Data

US 2011/0103015 A1    May 5, 2011

Related U.S. Application Data

(63) Continuation of application No. PCT/JP2008/063356, filed on Jul. 25, 2008.

(51) Int. Cl.
*H05K 7/20*    (2006.01)

(52) U.S. Cl.
USPC ............ 361/695; 361/679.47; 361/679.48; 361/679.49; 361/679.5; 361/696; 361/699; 165/122; 165/126; 454/184

(58) Field of Classification Search
USPC .......... 361/679.33, 679.46–679.53, 690–696, 361/715, 724–728; 165/80.3, 104.33, 121–126, 165/185; 312/223.2, 223.3, 236; 454/184; 62/259.2
See application file for complete search history.

(56) References Cited

U.S. PATENT DOCUMENTS

| | | | |
|---|---|---|---|
| 4,774,631 A * | 9/1988 | Okuyama et al. | 361/695 |
| 5,097,386 A * | 3/1992 | Byell et al. | 361/695 |
| 5,782,546 A * | 7/1998 | Iwatare | 312/236 |
| 6,075,698 A * | 6/2000 | Hogan et al. | 361/695 |
| 6,236,564 B1 * | 5/2001 | Fan | 361/695 |
| 6,317,320 B1 * | 11/2001 | Cosley et al. | 361/695 |
| 6,504,716 B2 * | 1/2003 | Huang et al. | 361/695 |
| 6,554,697 B1 * | 4/2003 | Koplin | 454/184 |
| 6,791,836 B2 * | 9/2004 | Cipolla et al. | 361/679.48 |
| 6,961,248 B2 * | 11/2005 | Vincent et al. | 361/796 |
| 7,054,155 B1 * | 5/2006 | Mease et al. | 361/695 |
| 7,295,436 B2 * | 11/2007 | Cheon | 361/699 |
| 7,319,594 B2 * | 1/2008 | Nicolai et al. | 361/724 |
| 7,578,733 B2 * | 8/2009 | Belady et al. | 454/184 |
| 7,619,887 B2 * | 11/2009 | Koch et al. | 361/696 |
| 7,729,116 B1 * | 6/2010 | Aybay et al. | 361/695 |
| 8,096,861 B2 * | 1/2012 | Hanafusa | 454/184 |
| 2003/0026074 A1 | 2/2003 | Clements et al. | |
| 2003/0198018 A1 * | 10/2003 | Cipolla et al. | 361/687 |
| 2005/0024825 A1 * | 2/2005 | Smith et al. | 361/687 |
| 2006/0256522 A1 * | 11/2006 | Wei et al. | 361/695 |
| 2008/0285228 A1 * | 11/2008 | Koch et al. | 361/687 |

FOREIGN PATENT DOCUMENTS

| | | |
|---|---|---|
| CN | 2544331 | 4/2003 |
| JP | 63-70499 | 3/1988 |
| JP | 8-172287 | 7/1996 |
| JP | 2001-257496 | 9/2001 |
| JP | 2003-99158 | 4/2003 |
| JP | 2008-156850 | 7/2008 |
| WO | 2007/084787 A2 | 7/2007 |

OTHER PUBLICATIONS

Korean Office Action mailed Jun. 20, 2012 issued in corresponding Korean Patent Application No. 10-2011-7001317.
International Search Report for PCT/JP2008/063356, mailed Oct. 28, 2008.

* cited by examiner

*Primary Examiner* — Michail V Datskovskiy
(74) *Attorney, Agent, or Firm* — Staas & Halsey LLP

(57) ABSTRACT

An electronic device includes: a chassis for housing an electronic unit; and a hold member capable of holding to a fan unit blowing air toward the electronic unit and attachable to and detachable from a plurality of positions of the chassis.

10 Claims, 10 Drawing Sheets

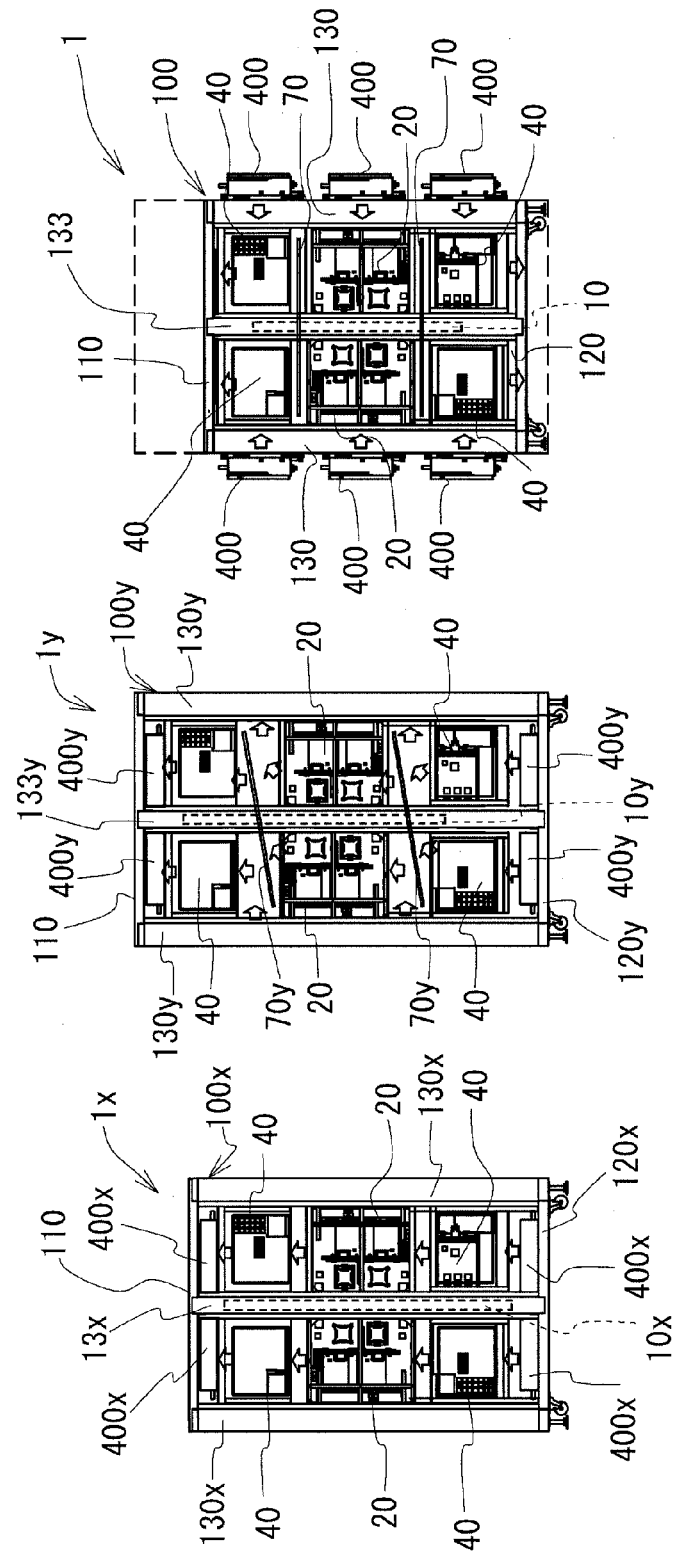

ELECTRONIC DEVICE

CROSS-REFERENCE TO RELATED APPLICATION

This application is a continuation application of PCT/JP2008/063356, filed on Jul. 25, 2008, the entire contents of which are incorporated herein by reference.

FIELD

The embodiment discussed herein is related to an electronic device.

BACKGROUND

There is known an electronic device which has a chassis in which plural electronic units are arranged. Since such an electronic unit houses an electronic part heating, there is known a fan unit, for cooling, which is attached within the chassis.

However, the position of the fan unit is generally limited at a given position. Thus, once the fan has already been set in the chassis, so that the position of the fan cannot be changed. For this reason, the position of the fan unit cannot be changed to blow air toward an electronic unit having the largest heat release value among other electronic units. This reduces the cooling efficiency of the electronic unit.

SUMMARY

In order to solve the above problem, an electronic device described herein includes a chassis housing an electronic unit, and a hold member capable of holding to a fan unit blowing air toward the electronic unit, and attachable to and detachable from a plurality of positions of the chassis.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 9A to 9C are comparative views of the server according to the present embodiment and a server having a different structure from that of the server according to the present embodiment.

DESCRIPTION OF EMBODIMENTS

An example of an embodiment will be described with reference to drawings as follows.

Figure 1:
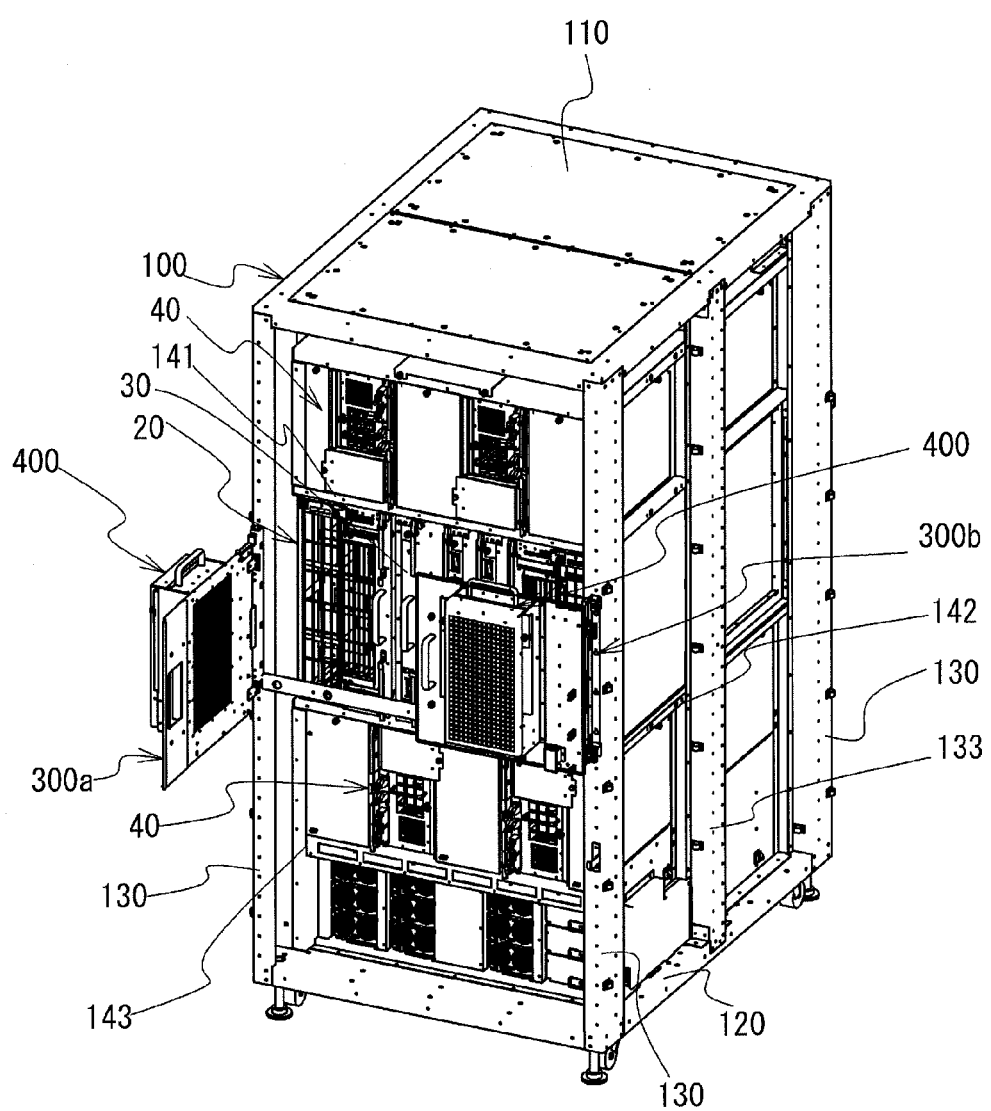
FIG. 1 is a perspective view of a server.

An electronic device according to an example of the embodiment will be explained. A server 1 will be explained for an example as an electronic device. FIG. 1 is a perspective view of the server 1. The server 1 includes: a chassis 100; a backplane 10, as will be described later, housed in the chassis 100; and units (electronic units) 20, 30 and 40 electrically connected to the backplane 10. The unit 20, 30 and 40 are housed in the chassis 100.

Each of the units 20, 30 and 40 includes a printed circuit board (not illustrated) mounting electronic parts (not illustrated) such as a microprocessor, memory, a hard disk, and a heat sink. The backplane 10 is provided for sending signals and supplying electricity to the units 20, 30 and 40. These electronic parts are driven and heated by the supply of the electricity.

The units 20, 30 and 40 are attachable to and detachable from the backplane 10. The backplane 10 is provided with connectors (not illustrated) each corresponding to the unit. The connector provided in the backplane 10 is attachable to and detachable from a connector provided in a printed circuit board installed in each unit. The units 40 are arranged on an upper tray 141 of the chassis 100, and the units 20 and 30 are arranged on a middle tray 142, and the units 40 are arranged on a lower tray 143. The units 40 are arranged to vertically sandwich the units 20 and 30. The unit 30 is thinner than each of the units 20 and 40.

The chassis 100 includes: a top board 110; a bottom board 120; four polls 130 and two polls 133 connecting the top and bottom boards 110 and 120. The pole 130 is connected to corners of the top and bottom boards 110 and 120. The pole 133 is connected to centers of the top and bottom boards 110 and 120. The chassis 100 is made of a metal with rigidity. Further, fan units 400 are provided at such a position to face the units 20 and 30, that is, at the middle stage, for cooling the units 20 and 30, as illustrated in FIG. 1. The fan units 400 are held by hold members 300a and 300b, respectively. The hold members 300a and 300b are attachable to and detachable from the chassis 100, and openable and closable with respect to the chassis 100. FIG. 1 illustrates the hold member 300a in an opened state.

Figure 2A:
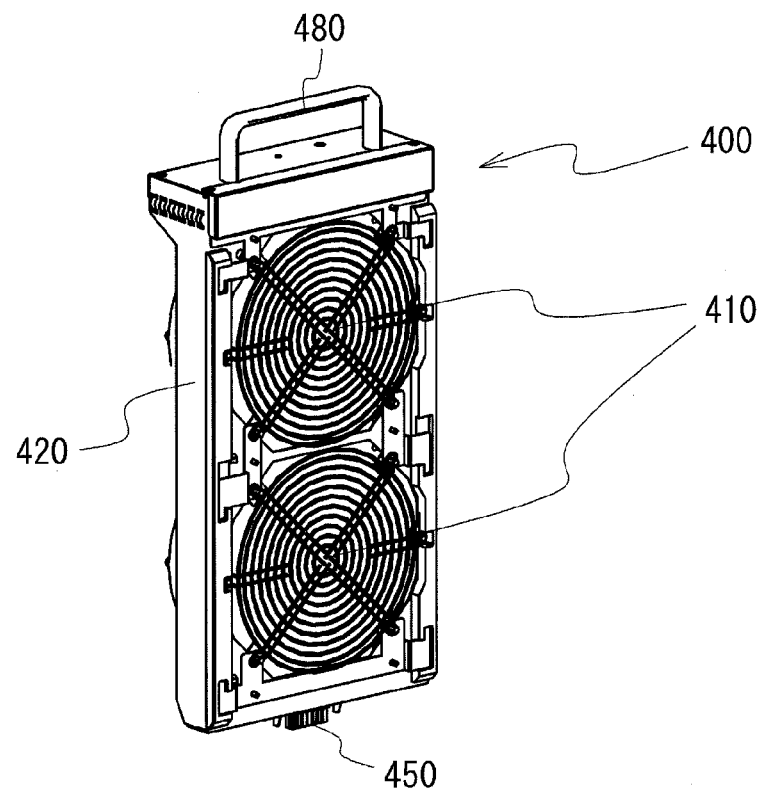
FIGS. 2A and 2B are explanatory views of a fan unit.
Figure 2B:
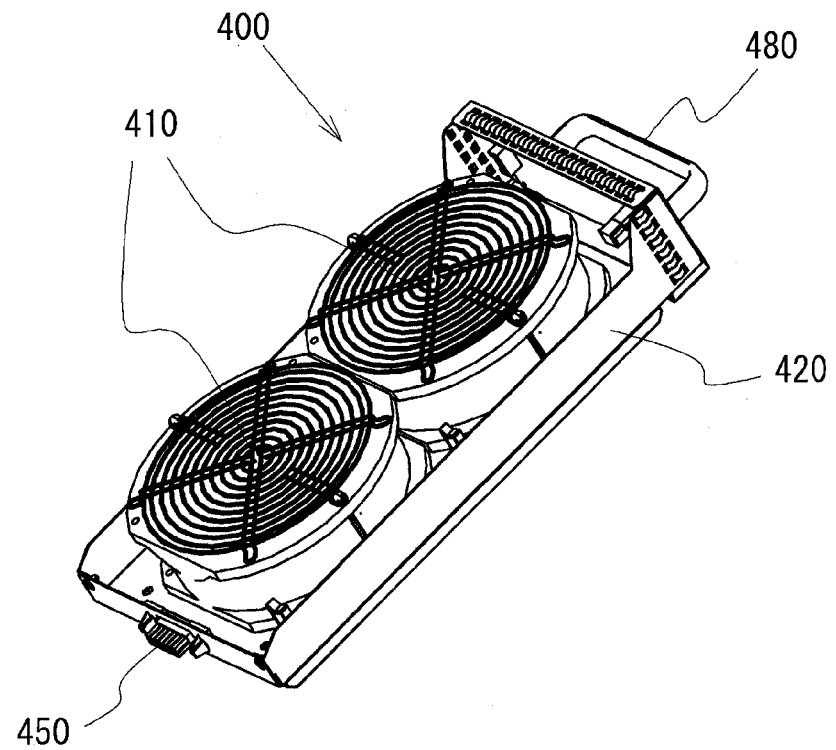

FIGS. 2A and 2B are explanatory views of the fan unit 400. The fan unit 400 includes: two fans 410; and a frame 420 holding the fans 410. A handle 480 is provided in the upper portion of the frame 420. A connector 450 is provided in the lower portion of the frame 420. The fan 410 is rotated by a built-in actuator (not illustrated). The connector 450 is provided for supplying electricity to the actuator.

Figure 3:
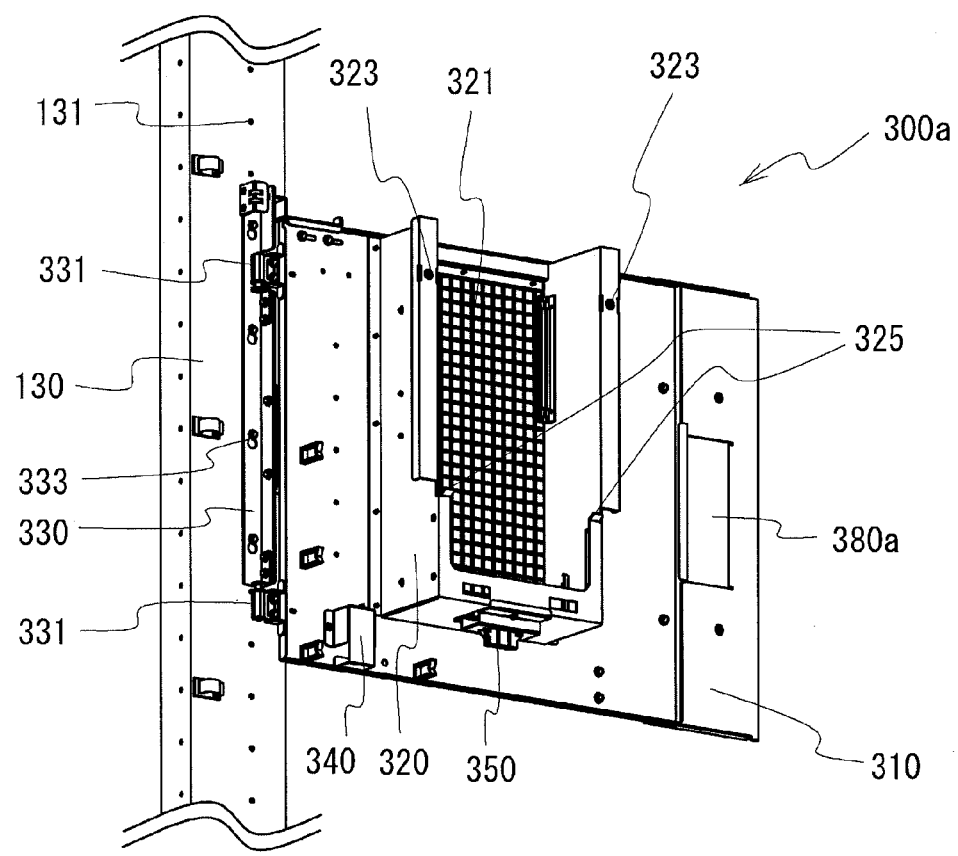
FIG. 3 is an explanatory view of a hold member.

The hold member 300a will be described. FIG. 3 is an explanatory view of the hold member 300a. Additionally, FIG. 3 illustrates the hold member 300a from which the fan unit 400 is detached.

The hold member 300a is made of a metal with rigidity. The hold member 300a includes: a base board 310; and a fixation board 330 connected to the side of the base board 310 through hinges 331. The base board 310 is provided with a housing portion 320 for housing the fan unit 400 at a surface thereof, specifically, at the surface facing the outside of the chassis 100 when the hold member 300a is closed. The housing portion 320 has a case shape with a cutout portion for allowing the fan unit 400 to be housed therein, to attach thereto, and to detach therefrom. The portion surrounded by the housing portion 320 is provided with a net 321 for ensuring air blown from the fan unit 400. Also, the bottom portion of the housing portion 320 is provided with the connector 350 for supplying electricity to the fan unit 400.

A switch 340 is provided adjacently to the housing portion 320. The switch 340 is provided at the surface facing the outside of the chassis 100 when the hold member 300a is closed. For this reason, the switch 340 is operable with ease, even when the hold member 300a is closed. The switch 340 maintains or cuts off electricity supplied to the fan unit 400 housed in the housing portion 320. The switch 340 and the connector 350 are electrically connected to each other through a cable (not illustrated). The switch 340 is connected to an external power supply through a cable (not illustrated).

The base board 310 of the hold member 300a is formed with an aperture 380a which is used as a handle for the operation of opening and closing the hold member 300a The fixation board 330 is fixed to the pole 130 of the chassis 100 by screws 333. Specifically, the pole 130 is provided with plural screw holes 131 at longitudinally equal intervals, whereby the fixation board 330 can be attached at a desirable position in the pole 130 by the screws 333. Therefore, the hold member 300a can be attached at plural positions in the height direction of the chassis 100. Also, by removing the screws 333, the hold member 300a can be detached from the pole 130 with ease. Thus, for example, the attachment positions of the hold members 300a and 300b can be changed to efficiently blow air toward the unit having a large heat release value. This improves the cooling efficiency.

Also, the base plate 310 and the fixation board 330 are pivotally connected to each other by the hinges 331. Hence, the base plate 310 is rotatably attached to the pole 130. This will be described later in detail.

Figure 4:
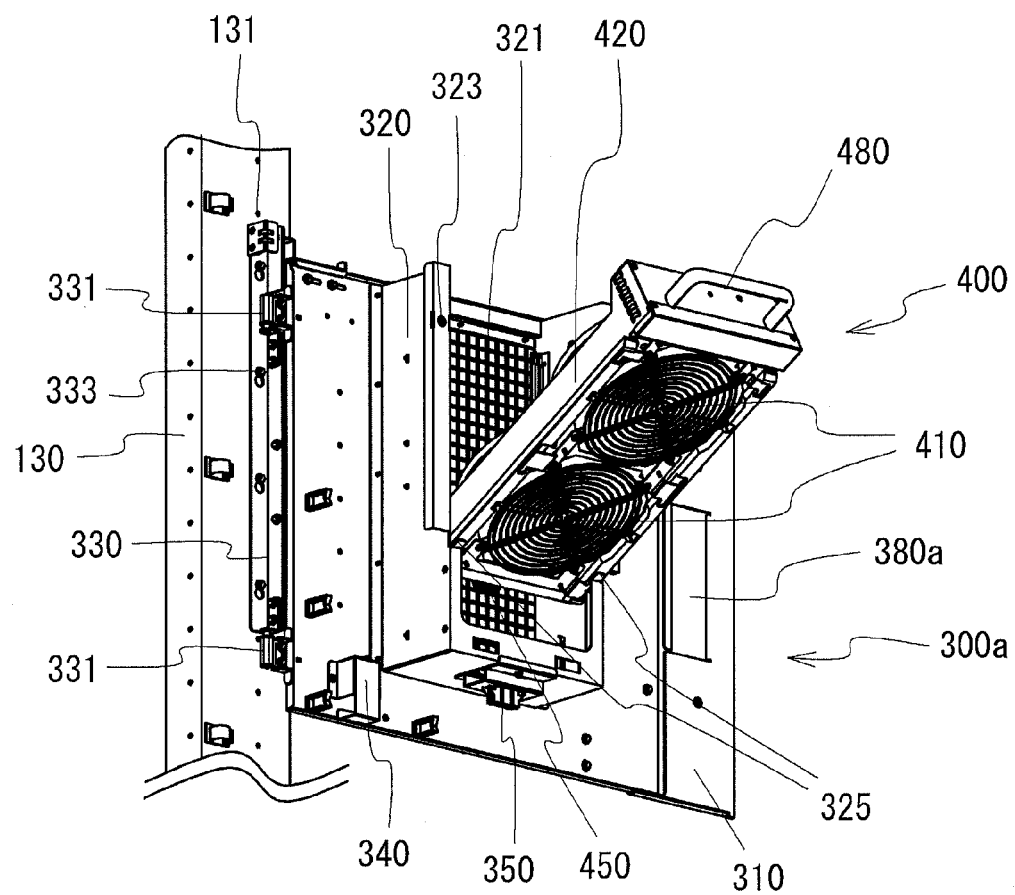
FIG. 4 is an explanatory view of a method for housing the fan unit.

Next, the method for housing the fan unit 400 in the hold member 300a will be described. FIG. 4 is an explanatory view of the method for housing the fan unit 400.

Figure 5:
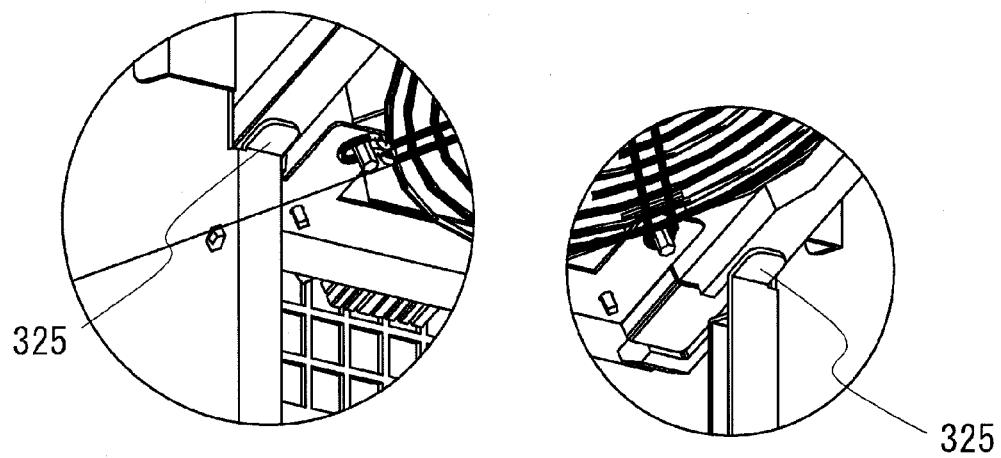
FIG. 5 is an enlarged view of a guide piece.

An operator grasps the handle 480 of the fan unit 400 and inserts the lower portion of the fan unit 400 into the cutout portion of the housing portion 320. The housing portion 320 has its front side provided with guide pieces 325 each having an end slanted forwardly. The fan unit 400 is guided by the guide pieces 325 to be tilted, whereby the operator can insert the fan unit 400 into the housing portion 320. The guide pieces 325 each has a function for guiding the fan unit 400 in the direction other than the vertical lower direction. FIG. 5 is an enlarged view of the guide pieces 325.

The operator inserts the fan unit 400 into the housing portion 320 in the tilted manner, and moves the handle 480 toward the hold member 300a. Then, the fan unit 400 is caused to be vertical, and the fan unit 400 is inserted in the vertical lower direction such that the connectors 450 and 350 are connected to each other. Thus, the fan unit 400 is housed in the housing portion 320.

The reason why the guide pieces 325 are provided will be explained. Generally, the fan unit 400 has a large weight. For this reason, when the fan unit 400 in the vertical state is housed in the housing portion 320, the fan unit 400 drops vertically to the bottom surface of the housing portion 320. As a result, a high load is applied to the housing portion 320. Such a load might degrade the durability of the hold member 300a and the fan unit 400, and specifically, that of the connectors 350 and 450. However, by the provision of the guide pieces 325, the tilted fan unit 400 is guided to be inserted to the housing portion 320. Thus, the fan unit 400 is prevented from dropping vertically, thereby reducing the load applied to the hold member 300a and the fan unit 400. This improves the durability of the hold member 300a and that of the fan unit 400.

Additionally, the connection between the connectors 350 and 450 is maintained by the weight of the fan unit 400. This is because the connector 450 is provided in the lower portion of the fan unit 400 and the connector 350 is provided in the bottom surface, corresponding to the connector 450, of the housing portion 320. This prevents the connection between the connectors 350 and 450 from being improperly disconnected from each other.

Figure 6:
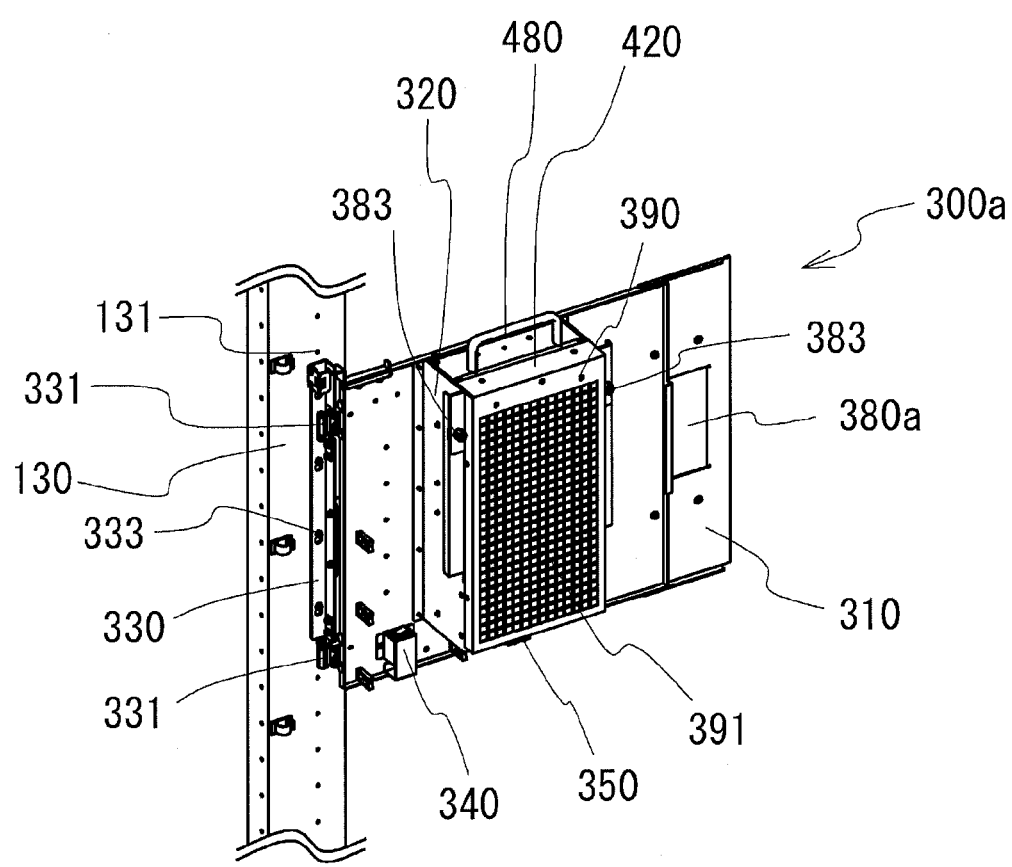
FIG. 6 is a view of the hold member holding the fan unit.

FIG. 6 illustrates the hold member 300a holding the fan unit 400. After the fan unit 400 is housed in the housing portion 320, a plate 390 is attached to the housing portion 320 to cover a front surface of the fan unit 400 exposed from the housing portion 320. The plate 390 is secured to the housing portion 320 by screw holes 323 provided at the side end of the housing portion 320 and by screws 383 threadedly engaged with the screw holes 323. The plate 390 is provided at its front surface with a net 391 for ensuring air blown by the fan unit 400.

Figure 7:
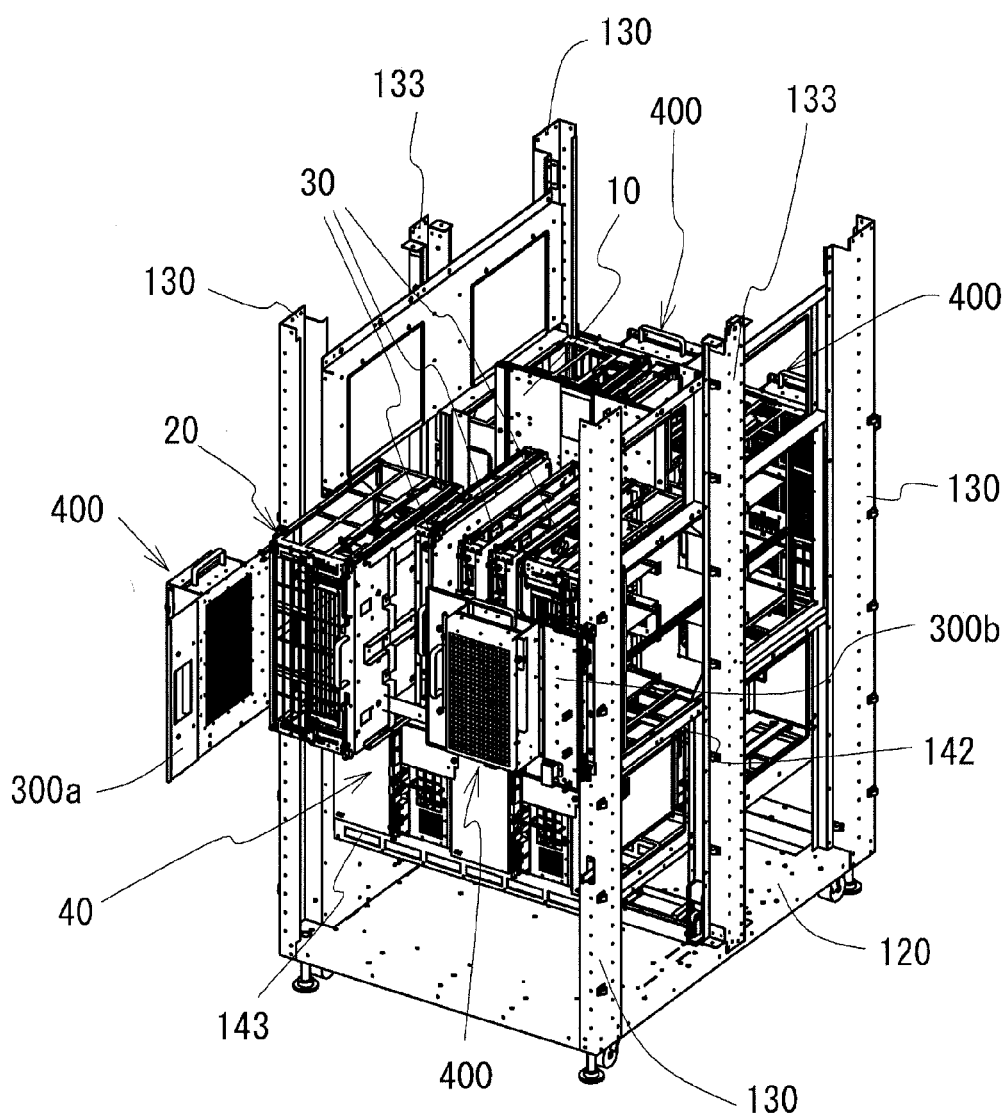
FIG. 7 is an explanatory view of opening and closing of the hold member.
Figure 8:
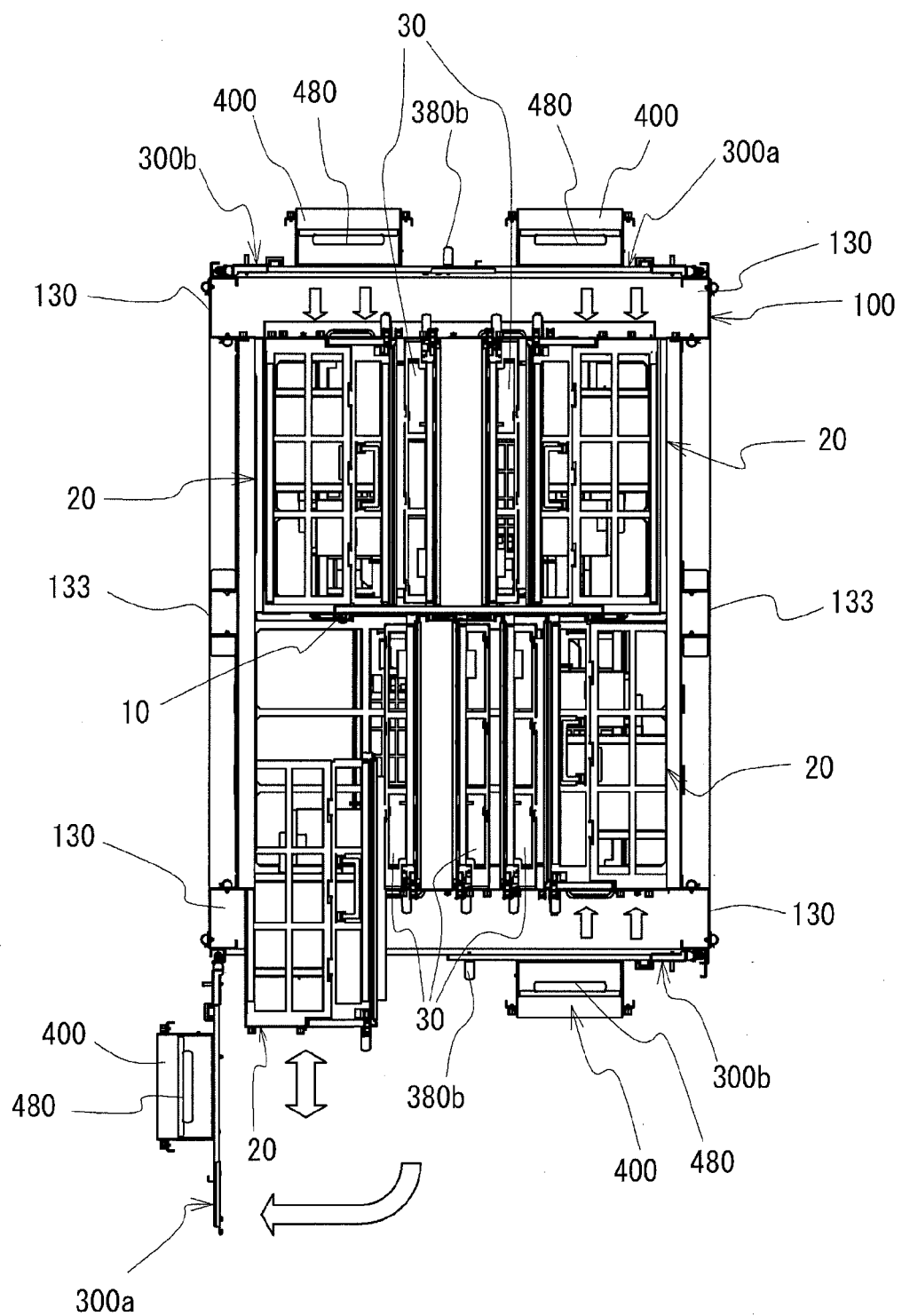
FIG. 8 is an explanatory view of opening and closing of the hold member.

Next, opening and closing of the hold members 300a and 300b will be described. FIGS. 7 and 8 are explanatory views of opening and closing of the hold members 300a and 300b. Additionally, some components are omitted in FIG. 7.

As illustrated in FIG. 7, for example, when the unit 20 is detached from the backplane 10, that is, when the unit 20 is detached from the backplane 10, the hold member 300a and 300b are opened to remove the unit 20. Further, the connection of a new unit to the backplane 10 is enabled by opening the hold member 300a. In this way, while preventing the interference of the fan unit 400 and the unit 20, 30 and 40, the fan unit 400 can be attached at a desirable position. This can suppress the complication of the connection, attachment, and detachment of the units 20, 30 and 40.

Further, the hold member have only to be opened, when the unit is attached or detached. Thus, as illustrated in FIG. 7, when the unit 20 arranged at the left side is attached or detached, only the hold member 300a is opened while the hold member 300b is closed. The hold member 300b is closed, thereby maintaining air blowing toward the unit facing the hold member 300b. This can suppress the reduction in the cooling efficiency to the minimum at the time the unit is attached or detached.

FIGS. 9A, 9B and 9C are comparative views of the server 1 according to the present embodiment and servers 1x and 1y each having a structure different from that of the server 1. FIGS. 9A, 9B and 9C are side views of the server 1x, 1y and 1, respectively. Additionally, FIG. 9C illustrates the server 1 different from the server 1 illustrated in FIG. 1, and illustrates the server 1 having the fan units 400 attached on all the upper, middle, and lower stages.

As illustrated in FIG. 9A, fan units 400x are provided at the position lower than the unit 40 arranged on the lower stage, and are provided at a position higher than the unit 40 arranged on the upper stage. Thus, the fan units 400x are arranged to sandwich the plural units 20 and 40 in the lengthwise direction. The fan unit 400x on the lower stage is arranged on the bottom board 120x, and blows air upwardly. Further, the fan unit 400x on the upper stage blows air upwardly. Furthermore, the backplane 10x is arranged to separate the units arranged at the left side from the units arranged the right side. The fan units 400x are arranged within the chassis 100x.

For this reason, air receives heat from the unit 40 arranged at the most lower position, flows through the unit 20 arranged at the middle stage and receives heat from the unit 20, then flows into the unit 40 arranged at the upper stage. This reduces the cooling efficiencies of the units 20 and 40 arranged in the middle and upper stages. Also, the fan units 400x are arranged in the height direction, so that the entire height of the server 1x becomes large, as illustrated in FIG. 9A.

Moreover, as illustrated in FIG. 9B, fan units 400y are arranged within the chassis 100y. Further, a rectification boards 70y is arranged in a tilting manner between the units 40 arranged at the lower stage and the units 20 arranged at the upper stage. Also, a rectification board 70y is arranged between the units 20 arranged at the middle stage and the units 40 arranged at the upper stage. By the arrangement of the rectification board 70y between the middle and lower stages, air blown by the fan unit 400y arranged at the lower stage can be escaped to the side of the chassis 100y. By the arrangement of the rectification board 70y between the middle and upper stages, air blown by the fan unit 400y arranged in the upper stage can be introduced from the side of the chassis 100y to be escaped from the upper thereof. This improves the cooling efficiencies of the units 40 arranged in the upper and lower stages.

However, such rectification boards 70y is arranged, thereby making the height of the chassis 100y large. Since air cannot be directly blown to the units 20, thereby reducing the cooling efficiencies of the units 20 arranged in the middle stage.

As illustrated in FIG. 9C, the fan units 400 are arranged on the side faces of the chassis 100 at the upper, middle, and lower stages, respectively. Also, rectification boards 70 are provided and separates the upper, middle, and lower stages from one another. The fan units 400 are arranged on the side faces of the chassis 100, thereby reducing the height of the chassis 100. Further, the rectification boards 70 are arranged horizontally, thereby suppressing the upsizing of the chassis 100 in its height direction. Furthermore, the fan units 400 are arranged at the outside of the chassis 100, thereby preventing the interference of the fan units 400 with the units 20 and 40. This can ensure the housing space for the units 20 and 40 within the chassis 100.

The fan unit 400 arranged in the lower stage introduces air from the outside of the chassis 100 and blows the air to the unit 40. The air blown from the fan unit 400 arranged in the lower stage is interrupted by the backplane 10 to flow toward the lower side of the chassis 100. Also, the fan unit 400 arranged in the middle stage blows air toward the unit 20. The air blown from the fan unit 400 arranged in the middle stage is interrupted by the backplane 10 to flow toward the front or the rear of FIG. 9C. The fan unit 400 arranged in the upper stage blows air toward the unit 40. Air blown by the fan unit 400 arranged in the upper stage flows toward the upper side of the chassis 100. In this way, the fan unit 400 can be attached to face the unit arranged in each stage. Accordingly, air which has not yet received heat can be blown from the outside toward all units, thereby improving the cooling efficiencies of all units.

Figure 10A:
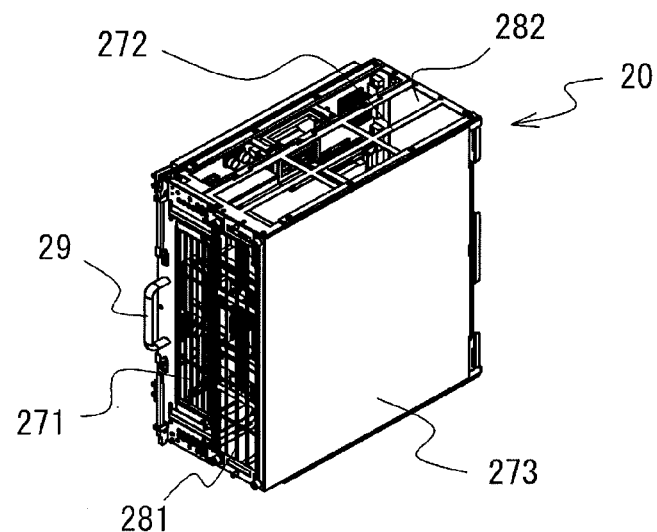
FIGS. 10A to 10C are explanatory views of the unit.
Figure 10B:
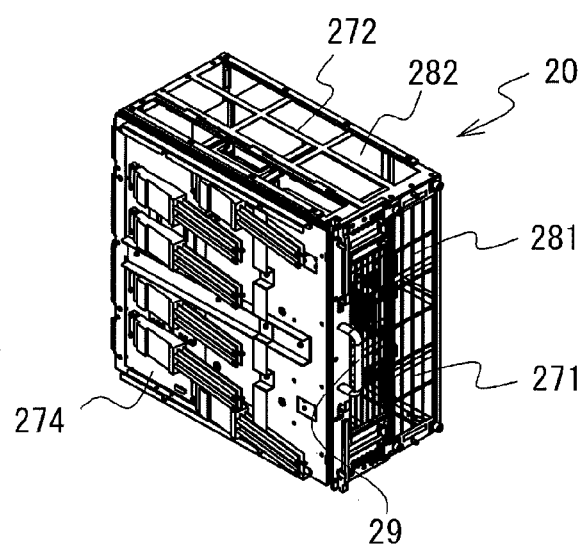
Figure 10C:
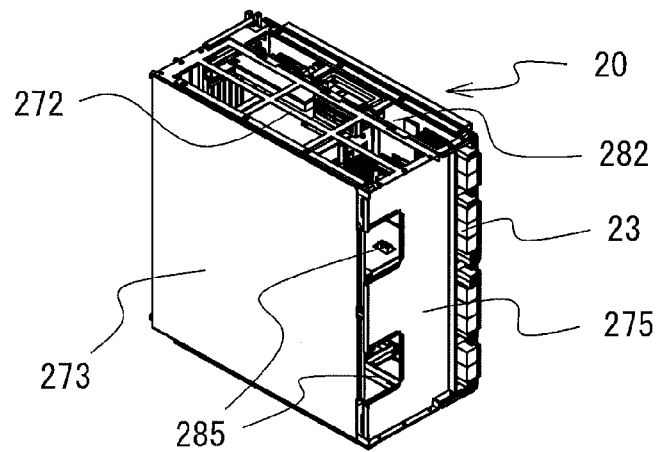

Next, the unit 20 will be briefly explained. FIGS. 10A, 10B and 10C are explanatory views of the unit 20. FIG. 10A is a perspective view of the unit 20 when viewed from its right side. FIG. 10B is a perspective view of the unit 20 when viewed from its left side. FIG. 10C is a perspective view of the unit 20 when viewed from its rear side.

A front panel 271 is provided at the front surface of the unit 20 and is made of a metal. A handle 29 is provided in the front panel 271. The front panel 271 has a fence shape and plural air holes 281. Similarly, an upper panel 272 has plural air holes 282. Also, a rear panel 275 has two air holes 285. Further, a connector 23 is provided at the rear panel 275 side, and is connected to a connector (not illustrated) provided in the backplane 10. The connector 23 is mounted on a printed circuit board installed in the unit 20. There is no air hole provided in side panels 273 and 274. The air holes 281, 282 and 285 function to introduce air blown by the fan unit 400 into the unit 20, and to exhaust the air.

The above embodiment is an example of a preferred embodiment according to the electronic device. Although the embodiment of the present inventions has been described in detail, it should be understood that the various changes, substitutions, and alterations could be made hereto without departing from the sprit and scope of the invention.

In the above embodiments, a server is explained as an example. However, the present invention is applicable to a router or switching equipment.

What is claimed is:

1. An electronic device, comprising:
   an electronic unit;
   a chassis that houses the electronic unit;
   a fan unit that blows air toward the electronic unit; and
   a hold member capable of holding the fan unit, and attachable to and detachable from a plurality of positions on the chassis,
   wherein the hold member is attachable to a lateral side of the chassis.

2. The electronic device of claim 1, wherein the hold member includes a hinge portion that pivotally supports the hold member on the chassis.

3. The electronic device of claim 1, wherein the hold member holds the fan unit at an outside of the chassis.

4. The electronic device of claim 1, wherein the hold member is attachable to a plurality of positions along a height direction of the chassis.

5. The electronic device of claim 1, wherein the hold member comprises:
   a fixation portion attachable to and detachable from the chassis;
   a hinge portion;
   a base portion rotatably connected to the fixation portion via the hinge portion; and
   a housing portion that is provided on the base portion and houses the fan unit.

6. The electronic device of claim 5, wherein the hold member comprises a hold member side connector electrically connected to a fan side connector provided in the fan unit while the fan unit is housed in the housing portion.

7. The electronic device of claim 6, wherein the fan side connector is provided at a bottom of the fan unit and the hold member side connector is provided at an inner bottom of the hold member.

8. The electronic device of claim 5, wherein the housing portion comprises a guide piece that guides the fan unit inserted into the housing portion in a direction other than a vertical lower direction.

9. The electronic device of claim 5, wherein the housing portion is provided on a surface of the base unit facing an outside of the chassis when the hold member is closed.

10. The electronic device of claim 5, further comprises a switch that conducts or cuts off electricity supplied to the fan unit from the chassis, and is provided at a surface of the base unit facing an outside of the chassis.

\* \* \* \* \*